(12) United States Patent
Nagano et al.

(10) Patent No.: US 8,454,933 B2
(45) Date of Patent: Jun. 4, 2013

(54) POLYCRYSTALLINE MAGNESIUM OXIDE (MGO) SINTERED BODY AND MGO SPUTTERING TARGET

(75) Inventors: Mitsuyoshi Nagano, Fukuoka (JP); Masanobu Takasu, Fukuoka (JP); Yo Arita, Yamaguchi (JP); Satoru Sano, Yamaguchi (JP)

(73) Assignees: Nippon Tungsten Co., Ltd., Fukuoka (JP); Ube Material Industries, Ltd., Yamaguchi (JP)

( * ) Notice: Subject to any disclaimer, the term of this patent is extended or adjusted under 35 U.S.C. 154(b) by 348 days.

(21) Appl. No.: 12/811,541

(22) PCT Filed: Jan. 27, 2009

(86) PCT No.: PCT/JP2009/051259
§ 371 (c)(1),
(2), (4) Date: Aug. 9, 2010

(87) PCT Pub. No.: WO2009/096384
PCT Pub. Date: Aug. 6, 2009

(65) Prior Publication Data
US 2010/0294657 A1    Nov. 25, 2010

(30) Foreign Application Priority Data
Jan. 28, 2008    (JP) ................. 2008-016246

(51) Int. Cl.
| | | |
|---|---|---|
| C01B 13/14 | (2006.01) | |
| C01F 5/02 | (2006.01) | |
| C01F 5/14 | (2006.01) | |
| C01F 11/02 | (2006.01) | |
| B28B 1/00 | (2006.01) | |
| B28B 3/00 | (2006.01) | |
| B28B 5/00 | (2006.01) | |
| C04B 33/32 | (2006.01) | |
| C04B 33/36 | (2006.01) | |
| C04B 35/64 | (2006.01) | |
| C23C 14/00 | (2006.01) | |
| C25B 11/00 | (2006.01) | |
| C25B 13/00 | (2006.01) | |
| C22C 1/04 | (2006.01) | |
| B22F 3/15 | (2006.01) | |

(52) U.S. Cl.
USPC ........... 423/636; 423/635; 264/653; 264/681; 204/298.13; 419/48; 419/49

(58) Field of Classification Search
USPC .................. 423/635, 636; 501/108; 264/648, 264/653, 663, 664, 666, 676, 681; 204/298.13; 419/48, 49
See application file for complete search history.

(56) References Cited

U.S. PATENT DOCUMENTS

| | | | | |
|---|---|---|---|---|
| 3,886,254 | A * | 5/1975 | Tanaka et al. | 264/332 |
| 4,356,272 | A * | 10/1982 | Kanemitsu et al. | 501/87 |
| 4,659,508 | A * | 4/1987 | Higuchi et al. | 252/516 |
| 4,678,761 | A * | 7/1987 | Virkar et al. | 501/104 |
| 5,158,915 | A * | 10/1992 | Morita et al. | 501/108 |
| 5,342,564 | A * | 8/1994 | Wei et al. | 264/656 |
| 5,391,339 | A * | 2/1995 | Wei et al. | 264/666 |
| 5,854,157 | A * | 12/1998 | Hwang et al. | 501/104 |
| 6,995,104 | B2 * | 2/2006 | Park et al. | 501/108 |
| 2006/0183625 | A1 * | 8/2006 | Miyahara | 501/98.4 |
| 2009/0101493 | A1 * | 4/2009 | Nakayama et al. | 204/192.11 |

FOREIGN PATENT DOCUMENTS

| | | | | |
|---|---|---|---|---|
| JP | 7133149 | A | | 5/1995 |
| JP | 10158826 | A | * | 6/1998 |
| JP | 11139862 | A | * | 5/1999 |
| JP | 2005330574 | A | | 12/2005 |
| JP | 2006069811 | A | * | 3/2006 |
| JP | 2006169036 | A | | 6/2006 |

OTHER PUBLICATIONS

English translation of International Search Report published Aug. 6, 2009 for PCT/JP2009/051259 filed Jan. 27, 2009.

* cited by examiner

*Primary Examiner* — Anthony J Zimmer
(74) *Attorney, Agent, or Firm* — Marty Fleit; Paul D. Bianco; Fleit Gibbons Gutman Bongini Bianco

(57) ABSTRACT

The invention provides a polycrystal magnesium oxide (MgO) sintered body which is capable of having a sintered density close to a theoretical density thereof. The MgO sintered body exhibits excellent mechanical properties and heat conductivity, while reducing contamination of an atmosphere due to gas generation. The invention also provides a production method for the sintered body. The polycrystal MgO sintered body has a unique crystalline anisotropy in which (111) faces are oriented along a surface applied with a uniaxial pressure at a high rate. The polycrystalline MgO sintered body is obtained by a method which includes the steps of: sintering an MgO raw material powder, having a particle size of 1 μm or less, under a uniaxial pressure and then subjecting the sintered powder to a heat treatment under an atmosphere containing 0.05 volume % or more of oxygen, at a temperature of 1273 K or more for 1 minute or more.

19 Claims, No Drawings

POLYCRYSTALLINE MAGNESIUM OXIDE (MGO) SINTERED BODY AND MGO SPUTTERING TARGET

TECHNICAL FIELD

The present invention relates to a polycrystalline MgO sintered body (hereinafter referred to simply as "MgO sintered body") to be obtained by sintering an MgO raw material powder, a production method therefor, and a MgO sputtering target using the MgO sintered body.

BACKGROUND ART

MgO is used for various purposes including heat-resistant applications (see the following Patent Documents 1 and 2) because it is a material having excellent heat conductivity, heat resistance, chemical stability, oxidation resistance and isolation performance MgO is relatively excellent in sinterability, and capable of obtaining denseness of up to almost 99% in terms of relative density, even by normal sintering. In reality, it is difficult to increase a sintered density of an MgO sintered body to a theoretical density thereof, and pores, such as micropores and several-micrometer pores, remain in the sintered body. It is contemplated to increase a sintering temperature with a view to improvement in sintered density (reduction in pores). However, if the sintering temperature is increased while placing a top priority on the improvement in sintered density, crystal grain growth will be promoted, resulting in a situation where pores remain in coarse crystal grains. Such pores are hardly eliminated even by a subsequent hot isostatic pressing (HIP) treatment at high temperatures and pressures.

As above, the conventional MgO sintered body is insufficient in sintered density thereof, and grain growth will occur if it is attempted to increase the sintered density. Thus, when it is used, particularly, as a jig or a structural member such as a heat-insulating board, there are the following problems.

1) Deterioration in Mechanical Properties (1) Deterioration in Strength

Strength includes bending strength, compressive strength and shearing strength, each of which depends on remaining pores inside the sintered body. Further, coarse grains resulting from grain growth during sintering are also likely to become an origin of destruction or breakage. The insufficient strength due to the pores and the grain growth gives rise to fatal damage, such as fracture or chipping, in use as a structural member.

(2) Deterioration in Hardness

The presence of the pores and the grain growth also poses a risk of deteriorating hardness, and thereby leads to deterioration in abrasion resistance, which causes a reduction in usable life of the structural member due to abrasion.

2) Deterioration in Surface Smoothness

The presence of the pores and the grain growth inside the sintered body means that a surface smoothness is deteriorated. In use as a structural member, there are many applications requiring a high surface smoothness in a working surface. If the surface smoothness is low, the structural member has problems, such as (1) a problem that pores in a sliding surface triggers chipping to encourage deterioration in the surface smoothness, resulting in a reduction in usable life of the structural member; and (2) a problem that the deterioration in the surface smoothness causes an increase in friction coefficient, resulting in the occurrence of a trouble, such as abnormal heat generation, or reaction or adhesion with a counterpart member.

3) Deterioration in Heat Conductivity

MgO has characteristics of high heat conductivity. One factor spoiling the heat conductivity is the presence of pores. Specifically, if there are pores or impurities in grain boundaries, heat conduction is hindered to preclude a possibility to obtain the inherent heat conductivity. Thus, as a prerequisite to obtaining high heat conductivity, it is necessary to reduce the pores, i.e., increase a relative density of the sintered body to almost 100% of the theoretical density.

4) Contamination of Atmosphere Due to Gas Generation

Gas of a sintering atmosphere is trapped in each pore residing in the sintered body. For example, in sintering under ambient atmosphere, components of ambient air, such as nitrogen gas, carbon dioxide and oxygen, will be trapped to form pores. In sintering under an argon or nitrogen gas atmosphere, the gas will be trapped to form pores. If grain boundaries of the sintered body are softened during use in a high-temperature range, the trapped gas will be released from the sintered body. Particularly in applications refusing even a slight amount of imparities, such as semiconductor manufacturing, the released gas causes a critical defect.

The MgO sintered body is also frequently used as a sputtering target (see the following Patent Documents 3 and 4). In this sputtering target application, the improvement in the mechanical properties and the heat conductivity is a key factor in preventing breaking and peeling during sputtering, and the reduction in gas generation from the sintered body is a key factor in preventing contamination of an atmosphere inside a sputtering apparatus.

[Patent Document 1] JP 7-133149A
[Patent Document 2] JP 2006-169036A
[Patent Document 3] JP 10-158826A
[Patent Document 4] JP 2005-330574A

DISCLOSURE OF THE INVENTION

[Problem to be Solved by the Invention]

It is an object of the present invention to provide an MgO sintered body capable of having a sintered density close to a theoretical density thereof, and exhibiting excellent mechanical properties and heat conductivity, while reducing contamination of an atmosphere due to gas generation, and a production method for the MgO sintered body.

[Means for Solving the Problem]

The present invention provides a polycrystalline MgO sintered body which is obtained through a uniaxial pressure sintering process of sintering an MgO raw material powder under a uniaxial pressure. The polycrystalline MgO sintered body satisfies the following relation: $\alpha V(111) / \alpha H(111) > 1.5$, where the $\alpha V(111)$ is a value of $\alpha(111)$ in a surface of the sintered body applied with the uniaxial pressure, and the $\alpha H(111)$ is a value of the $\alpha(111)$ in a surface perpendicular to the surface applied with the uniaxial pressure. The $\alpha(111)$ is a (111) face ratio expressed as the following formula (1): $\alpha(111) = \{-0.4434 * (Ra)^2 + 1.4434 * Ra\}$ (1), where the Ra is expressed as the following formula: $Ra = I(111) / (I(111) + I(200))$, where the $I(111)$ is an X-ray diffraction intensity of an MgO (111) face in the sintered body, and the $I(200)$ is an X-ray diffraction intensity of an MgO (200) face in the sintered body.

Specifically, in order to achieve the above object, the present invention is designed to allow an MgO sintered body to have unique crystalline anisotropy. More specifically, the present invention has been accomplished based on knowledge that, in a conventional MgO sintered body obtained by normal sintering, crystal grain growth is observed mainly on (200) faces, whereas a sintered density of an MgO sintered body can be increased to almost 100% of a theoretical density thereof, while enhancing mechanical properties and other properties, by employing a uniaxial pressure sintering process to increase a ratio of (111) faces ((111) face ratio) in a surface of the sintered body applied with a uniaxial pressure.

As a temperature and/or a holding time during the uniaxial pressure sintering process are increased, crystal grains become increasingly coarsened to cause an increase in value of the "αV(111)" and therefore an increase in value of the "αV(111)/αH(111)". The coarsening of crystal grains leads to deterioration in strength and hardness, resulting in spoiling performance, for example, as an abrasion-resistant member. Thus, the "αV(111)/αH(111)" is preferably 20 or less.

An MgO sintered body is a solid-state sintered body, and therefore strength and hardness thereof are deteriorated along with an increase in crystal grain size. Thus, in view of ensuring characteristics, particularly, as a structural member, an average crystal grain size is preferably 30 μm or less, more preferably 20 μm or less.

Further, a purity of an MgO sintered body has an impact on contamination under a clean environment. Thus, it is essential to set the purity as high as possible, preferably, to 99.99% or more.

The MgO sintered body of the present invention can be suitably used as a sputtering target as well as a structural member. Sputtering of an MgO sputtering target is dominated by secondary electron emission. Thus, in terms of crystal faces, as the (111) face ratio becomes higher, sputtering efficiency becomes better. As mentioned above, in the MgO sintered body of the present invention, (111) faces are oriented along the surface applied with the uniaxial pressure at a high rate, so that the secondary electron emission is facilitated to improve the sputtering efficiency.

The MgO sintered body of the present invention having the above crystalline anisotropy can be obtained by sintering an MgO raw material powder having a particle size of 1 μm or less, under a uniaxial pressure, and then subjecting the sintered powder to a heat treatment under an atmosphere containing 0.05 volume % or more of oxygen, at a temperature of 1273 K or more for 1 minute or more.

Specifically, as a prerequisite to obtaining the MgO sintered body of the present invention having the above crystalline anisotropy, (1) Size Reduction of MgO Raw Material, (2) Sintering under Uniaxial Pressure, and (3) Heat Treatment under Oxygen Atmosphere, are essential, as described in detail below.

(1) Size Reduction of MgO Raw Material

MgO is a sinterable ceramic material capable of being sintered even by itself, and thereby crystal grains are likely to grow. Therefore, a fine powder is used as an MgO raw material to allow the (111) face ratio to be increased even under conditions which would otherwise cause the formation of crystals having (200) faces at a high rate. The anisotropy can be facilitated as long as the particle size of the MgO raw material powder is 1 μm or less. More preferably, the particle size is set to 0.5 μm or less.

(2) Sintering Under Uniaxial Pressure (Uniaxial Pressure Sintering)

If a pressure is applied during sintering, sintering performance is improved, so that a sintering temperature can be reduced as compared with normal sintering. If the sintering temperature can be reduced, crystal grain growth can be suppressed to obtain a dense sintered body consisting of fine crystals. Further, if a pressure is applied in a uniaxial direction during sintering by uniaxial pressure sintering, the (111) face ratio is increased in a surface applied with the uniaxial pressure, to develop the crystalline anisotropy of the present invention. In order to reliably develop the crystalline anisotropy, it is preferable to apply a pressure of 5 MPa or more. As for a technique for applying the pressure, while a technique of applying a load of 5 MPa or more on a pressing member during sintering by using an weight may be employed, it is preferable to employ a hot-pressing (HP) process. In order to more reliably eliminate pores in the MgO sintered body, it is preferable to additionally perform a hot isostatic press (HIP) sintering, after the uniaxial pressure sintering.

(3) Heat Treatment Under Oxygen Atmosphere

In an MgO sintered body sintered under a reduction atmosphere (oxygen reducing atmosphere), a part thereof is formed as crystals in an oxygen deficient (oxygen defect) state, and in a non-uniform microstructure having a grayish-white color. This oxygen deficiency becomes a factor hindering the formation of crystals with (111) faces as an aim of the present invention. Therefore, after the sintering, a heat treatment is performed under an oxygen atmosphere so as to accelerate the unique crystalline anisotropy obtained by the reduction in size of the MgO raw material powder and the uniaxial pressure sintering. As long as the atmosphere has an oxygen concentration of 0.05 volume % or more, the remainder may be nonoxidative gas, such as nitrogen gas or argon. Preferably, the oxygen concentration of the atmosphere is set to 0.1 volume % or more. The heat treatment needs to be performed at a temperature of 1273 K or more for a holding time of at least 1 minutes or more, preferably at a temperature of 1673 K or more for a holding time of 1 hour or more, to eliminate the oxygen deficiency so as to accelerate the formation of crystals with (111) faces.

Preferably, the MgO raw material powder to be used in the present invention contains $Mg(OH)_2$ in an amount of 0.01 to 0.2 mass %. $Mg(OH)_2$ exhibits a behavior to activate the sintering. Specifically, $Mg(OH)_2$ is changed to MgO while continuously releasing absorbed moisture and crystal water therefrom during sintering, so that it can increase a sintered density of an MgO sintered body without deteriorating a purity thereof. However, if the content of $Mg(OH)_2$ is greater than 0.2 mass %, it becomes difficult to fully dehydrate the $Mg(OH)_2$ during the sintering, and pores are more likely to remain in the sintered body. Further, if the content of $Mg(OH)_2$ is less than 0.01 mass %, the effect of activating the sintering cannot be obtained.

Impurities in the MgO raw material powder hinder sintering performance or characteristics of the sintered body, and have an impact on contamination under a clean environment. Thus, it is essential to reduce a concentration of the impurities as much as possible, preferably to less than 0.01 mass %. The above $Mg(OH)_2$ is excluded from the impurity concentration, because it is not an impurity of the MgO raw material powder.

EFFECT OF THE INVENTION

The MgO sintered body of the present invention is formed to have a unique crystalline anisotropy in which (111) faces exist in a surface applied with the uniaxial pressure at a high rate, so that pores in the sintered body can be reduced to increase the sintered density to almost 100% of the theoretical density. More specifically, differently from normal sintering causing crystals to isotropically grow, anisotropy occurs in crystal growth by applying the uniaxial pressure during sintering, to allow pores to be easily released outside along grain boundaries so as to achieve densification based on rearrangement of crystals. As a result, the following effects are obtained.

1) Improvement in Mechanical Properties (1) Improvement in Strength and Toughness The reduction in pores largely contributes to improvement in strength of the MgO sintered body. Particularly, as measures for improving bending strength, elimination of internal defects including pores, and reduction in size of crystal grains, are most effective. Thus, the present invention can significantly improve bending strength. In addition, fracture toughness is simultaneously improved, so that the MgO sintered body of the present invention can be used for a structural member requiring high strength and high toughness, for which a conventional MgO sintered body could not be used.

(2) Improvement in Abrasion Resistance (Hardness)

A structural member is often required to have abrasion resistance (hardness) as well as strength and toughness. A conventional MgO sintered body has not been employed in abrasion-resistant applications, such as an abrasion-resistant member, because of its low strength due to large crystal grain sizes. However, the MgO sintered body of the present invention reduced in crystal grain size and improved in strength is also improved in abrasion resistance. Further, crystal grains are finely formed, and thereby bonding strength therebetween is improved, so that excellent characteristics can be obtained in a blast abrasion evaluation, as compared with a conventional pressureless sintering-based MgO sintered body having no anisotropy.

2) Improvement in Heat Conductivity

Heat conductivity depends on MgO purity, porosity, a state of grain boundaries, etc. Particularly, hear conductivity is deteriorated due to the presence of pores. In the MgO sintered body of the present invention, hear conductivity is improved by the effect of reduction in porosity based on the densification. Thus, the sintered body of the present invention generally has a heat conductivity superior to that of the conventional normal sintering-based MgO sintered body.

3) Reduction in Gas Generation

Based on the reduction in pores, an amount of gas trapped in the pores is reduced, so that an amount of gas to be released from the sintered body can be reduced to suppress contamination of an atmosphere.

In the MgO sintered body of the present invention, (111) faces are oriented along the surface applied with the uniaxial pressure, at a high rate. Thus, when it is used as a sputtering target, secondary electron emission is facilitated to improve sputtering efficiency.

BEST MODE FOR CARRYING OUT THE INVENTION

An embodiment of the present invention will now be described based on the following Example.

A powder comprising, as a primary component, an MgO (magnesium oxide) powder having an average particle size of 0.2 μm, was dispersed in and mixed with a methanol solvent in a nylon pot containing nylon balls for 20 hours to obtain MgO slurry. After taking out the obtained MgO slurry from the nylon pot, an alcohol-based binder was added to the MgO slurry, and the mixture was granulated in a nitrogen atmosphere using a closed-cycle spray dryer.

The obtained granulated powder was shaped by die pressing, to obtain a plurality of compacts of samples for various evaluations. Then, each of the compacts was subjected to pressureless sintering (first sintering) under ambient atmosphere at a temperature of 1673 K, and then subjected to hot-press (HP) sintering (second sintering) under an argon atmosphere at a temperature of 1773, while applying a pressure of 20 MPa using a hot-pressing apparatus during the second sintering, to obtain a sintered body.

A part of the obtained sintered bodies were subjected to an HIP sintering (third sintering) under an argon atmosphere in a temperature range of 1673 to 1823 K at a pressure of 100 MPa, in order to increase denseness of the part of sintered bodies to eliminate pores.

Subsequently, each of the sintered bodies reduced under the inert gas atmosphere during the sintering process was subjected to an oxidation treatment under an oxidation atmosphere containing 18 volume % of oxygen, at a temperature of 1823 K for 5 hours, to oxidize a reduced portion of the sintered body. Each of the obtained sintered bodies was subjected to a grinding process to prepare a sample having a given size, and the sample was subjected to the evaluations.

As comparative samples, a sample prepared through only the pressureless sintering (hereinafter referred to as "normal sintered body"), a sample devoid of the heat treatment under the oxidation atmosphere after the sintering and a sample using an $Mg(OH)_2$ raw material powder, were prepared and subjected to the evaluations.

Table 1 shows a treatment process and a result of X-ray diffraction evaluation of crystalline anisotropy, for each of the samples.

TABLE 1

| | No. | Raw material powder | Average particle size (μm) | First sintering (pressureless sintering) | Second sintering (HP sintering) | Third sintering (HP sintering) | Heat treatment under oxygen atmosphere | $\alpha V(111)/\alpha H(111)$ |
|---|---|---|---|---|---|---|---|---|
| Inventive Sintered Body | 1 | MgO | 0.1 | ○ | ○ | ○ | ○ | 2.11 |
| | 2 | MgO | 0.1 | ○ | ○ | | ○ | 2.09 |
| | 3 | MgO | 0.5 | ○ | ○ | ○ | ○ | 1.95 |
| | 4 | MgO | 0.5 | ○ | ○ | | ○ | 1.98 |
| | 5 | MgO | 1 | ○ | ○ | ○ | ○ | 1.91 |
| | 6 | MgO | 1 | ○ | ○ | | ○ | 1.92 |
| Comparative Sintered Body | 7 | MgO | 0.1 | ○ | ○ | ○ | | 1.31 |
| | 8 | MgO | 0.1 | ○ | ○ | | | 1.30 |
| | 9 | MgO | 0.1 | ○ | | | | 1.25 |
| | 10 | MgO | 0.5 | ○ | | | | 1.14 |
| | 11 | MgO | 1 | ○ | | | | 1.09 |
| | 12 | Mg(OH) | 0.5 | ○ | | | ○ | 1.06 |
| | 13 | Mg(OH) | 0.5 | ○ | ○ | | ○ | 1.29 |

In Table 1, the mark "○" indicates that the sample has been subjected to the sintering or the heat treatment under the oxygen atmosphere. The crystalline anisotropy was evaluated based on a value of the "$\alpha V(111)/\alpha H(111)$", where the $\alpha V(111)$ is a value of the (111) face ratio "$\alpha(111)$" expressed as the aforementioned formula (1), in a surface (as a reference surface) applied with a hot-press pressure, i.e., the uniaxial pressure, and the αH(111) is a value of the (111) face ratio "α(111)" in a surface perpendicular to the surface applied with the uniaxial pressure. Specifically, a larger value of the "αV(111)/αH(111)" means that the (111) faces exist in the surface applied with the uniaxial pressure at a higher rate, and the sample has larger crystalline anisotropy. In the present invention, the "αV(111)/αH(111)" is required to be greater than 1.5. As for the comparative samples subjected to no uniaxial pressure sintering, a value of αV(111)/αH(111) was also calculated, where the αV(111) is a value of the "α(111)" in a reference surface, and the αH(111) is a value of the "α(111)" in a surface perpendicular to the reference surface.

As seen in Table 1, in each of the MgO sintered bodies of the present invention (inventive sintered bodies) prepared through the hot-press (HP) sintering and the heat treatment under the oxygen atmosphere, the value of the "αV(111)/αH (111)" is greater than 1.5, which shows that the inventive sintered body has unique crystalline anisotropy. Further, each of the inventive sintered bodies had an average crystal grain size of about 10 μm.

Although all of the inventive sintered bodies in this Example were subjected to the pressureless sintering (first sintering), the pressureless sintering (first sintering) may be omitted.

Table 2 shows a result of the evaluations for each of the samples illustrated in Table 1.

particle is indicated by ⊚. Further, a sample having a small amount of attached impurities or detached particles is indicated by Δ, and a sample having a large amount of attached impurities or detached particles is indicated by ×. As for the deterioration in degree of vacuum, each of the samples was formed into a size of 30×30×5 mm$^t$, and put in a heatable vacuum vessel. Then, a temperature of the vessel was increased at 1 K per minute to observe the deterioration in degree of vacuum due to a phenomenon that volatile impurities absorbed in pores and gas trapped in the pores are released through grain boundaries. In Table 2, a sample causing no or almost no deterioration in degree of vacuum is indicated by ⊚. Further, a sample causing the deterioration in degree of vacuum within a measuring range of a vacuum meter is indicated by Δ, and a sample causing the deterioration in degree of vacuum beyond the measuring range of the vacuum meter is indicated by ×. As for the breaking, each of the samples was used as a sputtering target, and then the presence or absence of breaking was checked. In Table 2, a sample having no breaking is indicated by ⊚. Further, a sample having breaking less frequently is indicated by Δ, and a sample having breaking frequently is indicated by ×.

The evaluation result illustrated in Table 2 will be specifically described below.

(1) Density and Porosity

As seen in Table 2, each of the inventive sintered bodies has a high sintered density and a significantly low porosity, as

TABLE 2

| | No. | αV(111)/αH(111) | Ultimate density (g/cm³) | Relative density (%) | Porosity (%) | Bending strength (MPa) | Hardness (GHz) | Characteristics as | Characteristics as target | | |
|---|---|---|---|---|---|---|---|---|---|---|---|
| | | | | | | | | | Attachment of impurities | Deterioration in degree of | Breaking |
| Inventive Sintered Body | 1 | 2.11 | 3.565 | 99.86 | 0.14 | 366 | 799 | ⊚ | ⊚ | ⊚ | ⊚ |
| | 2 | 2.09 | 3.561 | 99.75 | 0.25 | 358 | 789 | ⊚ | ⊚ | ⊚ | ⊚ |
| | 3 | 1.95 | 3.568 | 99.94 | 0.06 | 355 | 805 | ⊚ | ⊚ | ⊚ | ⊚ |
| | 4 | 1.98 | 3.562 | 99.78 | 0.22 | 351 | 788 | ⊚ | ⊚ | ⊚ | ⊚ |
| | 5 | 1.91 | 3.563 | 99.80 | 0.20 | 388 | 785 | ⊚ | ⊚ | ⊚ | ⊚ |
| | 6 | 1.92 | 3.559 | 99.69 | 0.31 | 351 | 792 | ⊚ | ⊚ | ⊚ | ⊚ |
| Comparative Sintered Body | 7 | 1.31 | 3.560 | 99.71 | 0.29 | 330 | 750 | Δ | Δ | Δ | Δ |
| | 8 | 1.30 | 3.558 | 99.66 | 0.34 | 300 | 730 | Δ | Δ | Δ | Δ |
| | 9 | 1.25 | 3.451 | 96.67 | 3.33 | 189 | 650 | X | X | X | X |
| | 10 | 1.14 | 3.402 | 95.29 | 4.71 | 178 | 639 | X | X | X | X |
| | 11 | 1.09 | 3.385 | 94.82 | 5.18 | 164 | 640 | X | X | X | X |
| | 12 | 1.06 | 3.343 | 96.19 | 3.81 | 235 | 695 | Δ | X | X | X |
| | 13 | 1.29 | 3.489 | 97.73 | 2.27 | 288 | 750 | Δ | Δ | Δ | Δ |

In the evaluations for each of the samples, density (ultimate density, relative density), porosity, bending strength, and hardness, were measured, and characteristics as a structural member were comprehensively evaluated based on the measurement result. In Table 2, as for the characteristics as a structural member, a sample evaluated as being sufficiently usable as a structural member is indicated by ⊚. Further, a sample evaluated as being usable as a structural member depending on conditions is indicated by Δ, and a sample evaluated as being unusable as a structural member is indicated by ×.

Further, in order to primarily evaluate characteristics as a sputtering target, attachment of impurities, deterioration in degree of vacuum, and breaking, were evaluated.

As for the attachment of impurities, each of the samples was formed into a size of 30×30×5 mm$^t$, and put in a solvent of purified water. Then, ultrasonic wave was applied to the solvent to check impurities mixed in the solvent and detached particles by a particle counter. In Table 2, a sample having no or almost no attached impurity and no or almost no detached compared with the normal sintered bodies. Each of the normal sintered bodies (samples No. 9 to 11) has a relative density of about 95%, so that a lot of pores remain in the sintered body, which appears as a significant difference in bending strength. The deterioration in bending strength becomes a critical defect in use as a structural member or a abrasion-resistant member. Each of the inventive sintered bodies is obtained as a sintered body having a dense and fine crystal structure with a relative density of 99% or more, and exhibiting excellent mechanical properties as compared with the normal sintered bodies.

(2) Bending Strength

Bending strength is an important characteristic as a resistance against fracture and chipping during use as a structural member. There are various techniques for improving the bending strength. A technical point effective in the improvement includes (a) reduction in porosity, (b) reduction in size of crystal grains, and (c) crystalline anisotropy. In the inventive sintered bodies, all of the three factors bring out advantageous effects to improve the bending strength as compared with comparative sintered bodies including the normal sintered bodies.

(3) Hardness

As with the bending strength, hardness is one important mechanical property for improving abrasion resistance as a structural member. A technical factor for improving the hardness is the same as that in the bending strength. In the inventive sintered bodies, the hardness is improved as compared with the comparative sintered bodies including the normal sintered bodies.

(4) Characteristics as Structural Member

Based on the above improvements in mechanical properties, the inventive sintered bodies can be used as a structural member, for which a conventional sintered body could not be used.

(5) Characteristics as Sputtering Target

If a sputtering target has pores, impurity particles are likely to be incorporated in the pores, so that the sputtering target cannot be used in applications having essential requirement of being impurity-free, such as semiconductor manufacturing. On the other hand, if a sintered body has substantially no pore as in the inventive sintered body, it can be suitably used as a sputtering target without attachment and mixing of impurity particles or deterioration in degree of vacuum. A sputtering target having substantially no pore means that it has improved mechanical properties, and gas which would otherwise reside therein is substantially fully eliminated. A sputtering target is worn along with a progress of sputtering, and an inside thereof is exposed accordingly. In this process, if the sputtering target has pores, the pores are opened, and gas is released therefrom to contaminate an atmosphere inside a sputtering apparatus. The gas trapped in pores consists of gas residing in an environment during the sintering. Specifically, oxygen and nitrogen are trapped during sintering under ambient atmosphere, or argon or nitrogen is trapped during sintering under a non-oxidation atmosphere. An amount of the gas depends on a porosity of a sputtering target. The present invention can achieve a sputtering target having a porosity of 0.5% or less, so that the gas amount is reduced to 1/60 or less of a conventional sputtering target to drastically improve impurity contamination inside the sputtering apparatus. During use, a front surface and a rear surface of a sputtering target is heated and cooled, respectively, i.e., the sputtering target is undergoing thermal shock, so that the sputtering target is more likely to be broken due to the thermal shock. Thermal shock resistance is proportional to bending strength and heat conductivity. Thus, the present invention can improve resistance against breaking of the sputtering target.

Sputtering of an MgO sputtering target is dominated by secondary electron emission. Thus, in terms of crystal faces, it is advantageous to increase a ratio of (111) faces. However, a conventional MgO sintered body produced by a normal sintering is unsuitable as a material for a sputtering target, in terms of the secondary electron emission, because a surface orientation thereof is primarily (200). In the present invention, (111) faces can be formed in a sputtering surface at a high rate by means of the fine powder and the sintering under pressure, so that the secondary electron emission is facilitated to improve sputtering efficiency. In other words, each of the inventive sintered bodies has a high (111) face ratio in a sputtering surface, which provides effects of reducing the porosity based on densification and facilitating the secondary electron emission, which are advantageous to a sputtering target.

Table 3 shows a difference in crystal formation before and after the treatment under the oxidation atmosphere. As seen in Table 3, the value of the "$\alpha V(111)$", or the (111) face ratio, in the surface applied with the hot-press pressure (uniaxial pressure), is increased by the treatment under the oxidation atmosphere.

TABLE 3

|  | Before heat treatment | Before heat treatment | XRDSTD |
|---|---|---|---|
| $\alpha V$ (111) | 0.202 | 0.288 | 0.128 |
| Lattice constant (Å) | 4.209 | 4.209 | 4.210 |

INDUSTRIAL APPLICABILITY

The MgO sintered body of the present invention is suitably useable as a sputtering target, as well as a high-temperature jig for producing electronic components, or a structural member, such as a furnace wall or a heat-insulating board.

The invention claimed is:

1. A polycrystalline magnesium oxide (MgO) sintered body which is obtained by a uniaxial pressure sintering process of sintering an MgO raw material powder under uniaxial pressure, the polycrystalline MgO sintered body satisfying relation: $\alpha V$ (111)/$\alpha H$ (111) >1.5, wherein $\alpha V$ (111) is a value of $\alpha$ (111) in a surface to which the uniaxial pressure is applied, and $\alpha H$ (111) is a value of $\alpha$ (111) in a surface perpendicular to the surface to which the uniaxial pressure is applied, wherein the $\alpha$ (111) is a (111) face ratio expressed as formula (1), $$\alpha(111)=\{-0.4434\times(Ra)^2+1.4434\times Ra\},$$

wherein the Ra is expressed as formula: Ra=I (111)/(1(111) +1 (200)), and wherein the I (111) is an X-ray diffraction intensity of a MgO (111) face in the sintered body, and the I (200) is an X-ray diffraction intensity of a MgO (200) face in the sintered body.

2. The polycrystalline MgO sintered body as defined in claim 1, wherein average crystal grain size is 30 μm or less.

3. The polycrystalline MgO sintered body as defined in claim 1, wherein MgO purity is 99.99% or more.

4. The polycrystalline MgO sintered body as defined in claim 2, wherein MgO purity is 99.99% or more.

5. The polycrystalline MgO sintered body as defined in claim 1, wherein the polycrystalline MgO sintered body has crystalline anisotropy.

6. A magnesium oxide (MgO) sputtering target comprising a polycrystalline MgO sintered body obtained by a uniaxial pressure sintering process of sintering an MgO raw material powder under uniaxial pressure, the polycrystalline MgO sintered body satisfying relation: $\alpha V$ (111)/$\alpha H$ (111) >1.5, wherein $\alpha V$ (111) is a value of $\alpha$ (111) in a surface to which the uniaxial pressure is applied, and $\alpha H$ (111) is a value of $\alpha$ (111) in a surface perpendicular to the surface to which the uniaxial pressure is applied, wherein the $\alpha$ (111) is a (111) face ratio expressed as formula (1), $$\alpha(111)=\{-0.4434\times(Ra)^2+1.4434\times Ra\},$$

wherein the Ra is expressed as formula: Ra=I (111)/(1(111) +1(200)), and wherein the I (111) is an X-ray diffraction intensity of a MgO (111) face in the sintered body, and the I (200) is an X-ray diffraction intensity of a MgO (200) face in the sintered body.

7. A magnesium oxide (MgO) sputtering target comprising the polycrystalline MgO sintered body as defined in claim 4.

8. A magnesium oxide (MgO) sputtering target comprising the polycrystalline MgO sintered body as defined in claim 2.

9. A magnesium oxide (MgO) sputtering target comprising the polycrystalline MgO sintered body as defined in claim 3.

10. The MgO sputtering target as defined in claim 6, wherein the polycrystalline MgO sintered body has crystalline anisotropy.

11. A method of producing the polycrystalline MgO sintered body as defined in claim 1, wherein the method comprises the steps of: sintering a MgO raw material powder, having a particle size of 1 μm or less, under uniaxial pressure; and, after sintering, subjecting the sintered powder to a heat treatment under an atmosphere containing 0.05 volume % or more of oxygen, at a temperature of 1273 K or more for 1 minute or more.

12. The method as defined in claim 11, wherein the MgO raw material powder contains magnesium hydroxide (Mg(OH)$_2$) in an amount of 0.01 to 0.2 mass %.

13. The method as defined in claim 11, wherein the MgO raw material powder has an impurity concentration of less than 0.01 mass %.

14. The method as defined in claim 11, wherein the uniaxial pressure in the step of sintering is set to 5 MPa or more.

15. The method as defined in claim 12, wherein the MgO raw material powder has an impurity concentration of less than 0.01 mass %.

16. The method as defined in claim 15, wherein the uniaxial pressure in the step of sintering is set to 5 MPa or more.

17. The method as defined in claim 12, wherein the uniaxial pressure in the step of sintering is set to 5 MPa or more.

18. The method as defined in claim 13, wherein the uniaxial pressure in the step of sintering is set to 5 MPa or more.

19. The method as defined in claim 11, wherein application of the uniaxial pressure results in anisotropic crystal growth.

\* \* \* \* \*

UNITED STATES PATENT AND TRADEMARK OFFICE
CERTIFICATE OF CORRECTION

PATENT NO. : 8,454,933 B2  
APPLICATION NO. : 12/811541  
DATED : June 4, 2013  
INVENTOR(S) : Nagano et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 359 days.

Signed and Sealed this
Eighth Day of September, 2015

Michelle K. Lee
*Director of the United States Patent and Trademark Office*